United States Patent
Yoshida et al.

(10) Patent No.: US 7,035,349 B2
(45) Date of Patent: Apr. 25, 2006

(54) SIGNAL COMPENSATION CIRCUIT AND DEMODULATING CIRCUIT WITH HIGH-SPEED AND LOW-SPEED FEEDBACK LOOPS

(75) Inventors: Akira Yoshida, Chiba (JP); Akira Horikawa, Chiba (JP); Shuichi Matsumoto, Chiba (JP)

(73) Assignee: Oki Electric Industry Co, Ltd., Tokyo (JP)

( * ) Notice: Subject to any disclaimer, the term of this patent is extended or adjusted under 35 U.S.C. 154(b) by 908 days.

(21) Appl. No.: 10/061,302

(22) Filed: Feb. 4, 2002

(65) Prior Publication Data

US 2002/0130698 A1    Sep. 19, 2002

(30) Foreign Application Priority Data

Mar. 14, 2001    (JP)    ............................. 2001-071381

(51) Int. Cl.
*H03K 3/00* (2006.01)
*H03K 5/13* (2006.01)

(52) U.S. Cl. ...................... 375/317; 375/318; 375/319; 375/324; 375/293; 455/296; 327/58; 327/69

(58) Field of Classification Search ........ 375/317–319, 375/354, 324–325, 293; 327/58–59, 72, 327/310, 362, 69; 329/321, 350; 330/291; 455/114.2, 114.3, 115.1, 296
See application file for complete search history.

(56) References Cited

U.S. PATENT DOCUMENTS

| | | | | |
|---|---|---|---|---|
| 4,272,845 A | * | 6/1981 | Fiumani | 375/293 |
| 4,535,294 A | * | 8/1985 | Ericksen et al. | 327/58 |
| 4,571,547 A | * | 2/1986 | Day | 327/69 |
| 5,369,470 A | * | 11/1994 | Hansen | 455/296 |
| 5,412,692 A | | 5/1995 | Uchida | 375/317 |
| 6,104,238 A | | 8/2000 | Mattisson et al. | 329/319 |
| 6,668,162 B1 | * | 12/2003 | Murtojarvi | 455/115.1 |

* cited by examiner

*Primary Examiner*—Khai Tran
*Assistant Examiner*—Edith Chang
(74) *Attorney, Agent, or Firm*—Venable LLP; Michael A. Sartori

(57) ABSTRACT

A signal compensation circuit compensates for direct-current offset of an input signal by amplifying the input signal with an amplifier having a variable direct-current offset. A low-speed negative feedback loop charges and discharges a capacitor in an integrating circuit according to the direct-current component of the amplified signal. A high-speed negative feedback loop charges and discharges the same capacitor at a faster rate when the amplified signal goes outside an allowable amplitude range. The capacitor potential is used to control the direct-current offset of the amplifier. The allowable amplitude range is adjusted according to the amplitude of the amplified signal. High-speed compensation can thus be combined with a tolerance for runs of identical code levels in the input signal.

11 Claims, 11 Drawing Sheets

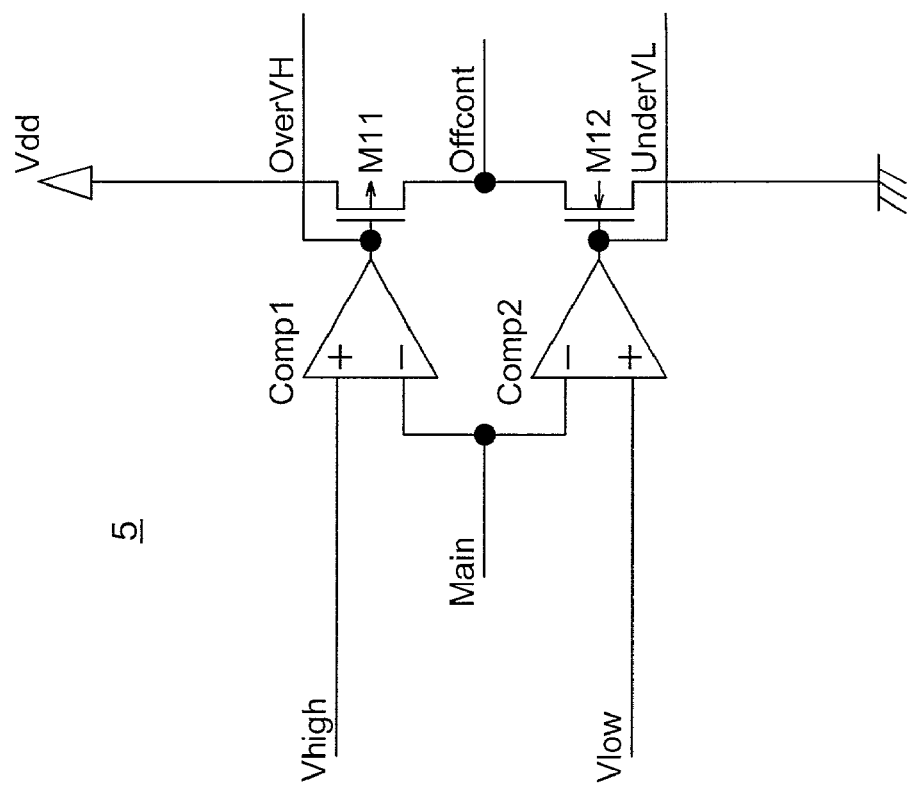

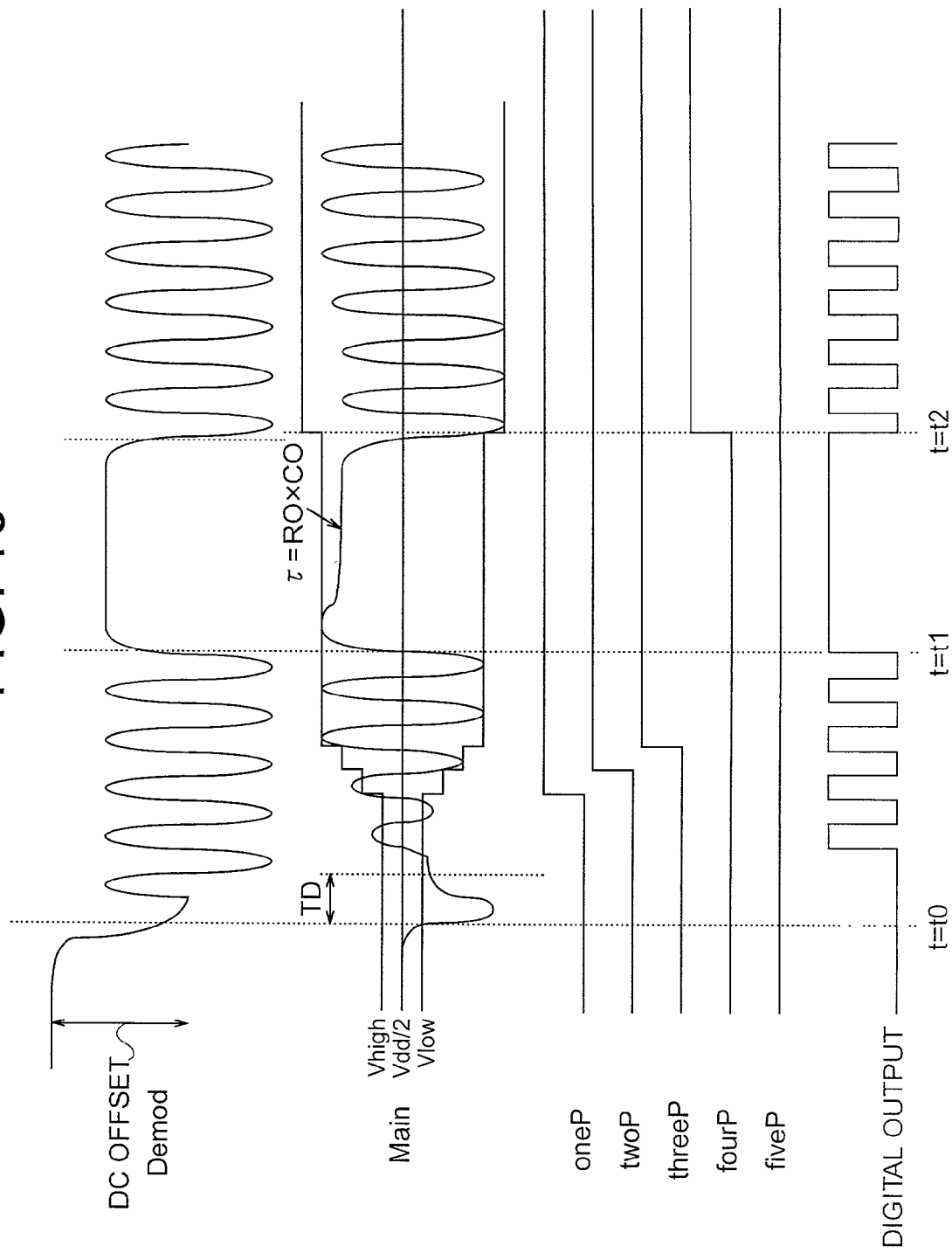

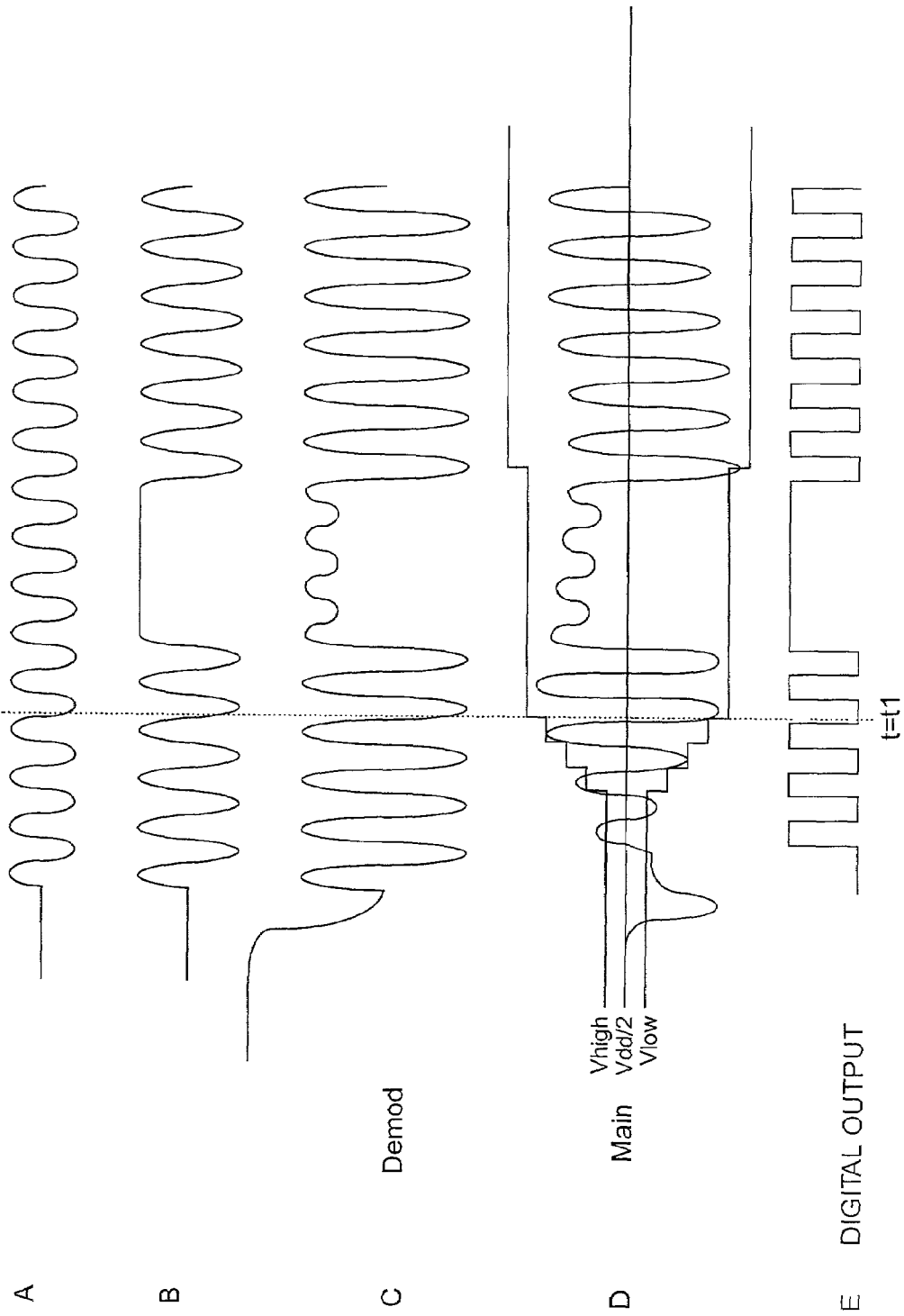

SIGNAL COMPENSATION CIRCUIT AND DEMODULATING CIRCUIT WITH HIGH-SPEED AND LOW-SPEED FEEDBACK LOOPS

BACKGROUND OF THE INVENTION

1. Field of the Invention

The present invention relates to a signal compensation circuit and a demodulating circuit that are useful in, for example, a mobile communications receiver.

2. Description of the Related Art

When a signal modulated by frequency-shift keying (FSK, a common modulation method in wireless communications) is demodulated, the direct-current (DC) component of the demodulated signal (also referred to as the detected signal) may include an undesired and variable offset due to, for example, a difference between the signal frequency and the predetermined carrier frequency.

U.S. Pat. No. 6,104,238 (hereinafter, Document D1) discloses a method of reducing DC potential variations in the detected output signal by varying the center frequency of, for example, a channel selection filter in a stage preceding the detector. In this method, variations in the DC offset are tracked by smoothing the detected signal and adding its DC component to the frequency control signal supplied to the filter.

U.S. Pat. No. 5,412,692 (hereinafter, Document D2) discloses a method of obtaining a final output signal by detecting the maximum and minimum levels of the detected output signal, generating a potential intermediate between them, and using the intermediate potential as a reference potential for a comparator circuit. The intermediate potential tracks DC offset variations in the detected output signal.

In some types of wireless communication systems, the data transmitting state alternates with the data receiving state; the two states may follow one another continuously, or there may be a rest interval between them (an interval in which data are neither transmitted nor received, although the power supply voltage is applied). Therefore, when the communication system switches into the data receiving state, the received signal reaches the receiver in a burst and the DC level of the detected signal changes dynamically.

In wireless communication systems, a preamble pattern, which is added to the head of the transmitted signal, is generally used to enable compensation for this dynamic DC offset. The pattern length, however, differs from one wireless communication system to another, and it is necessary to track the dynamic DC offset at high speed in order to demodulate a signal with an extremely short pattern length (a length of four bits, for example).

Moreover, the transmitted signal may include intervals in which the same code level (high level or low level) occurs successively; the demodulating circuit is required to operate without error over such runs of identical codes up to a run length specified for the application system. Generally speaking, the capability to tolerate long run lengths conflicts with the capability for high-speed DC offset compensation.

The circuit configuration described in Document D1 is problematic in that the time needed for DC offset compensation is the total sum of the time needed for smoothing the detected signal and the absolute delay times of the channel selection filter and detector, and in that high-speed DC offset compensation is difficult if a high-order filter is used in the demodulating circuit.

The circuit configuration described in Document D2 is also problematic, in that high-speed DC offset compensation requires the time constants of the integrating circuits that detect the maximum and minimum levels of the detected signal to be decreased, which reduces the run-length tolerance.

There is a need for a demodulating circuit that can execute rapid DC offset compensation and at the same time can tolerate DC offset variations caused by runs of identical codes, as well as a need for a signal compensation circuit that is suitable to be applied in such a demodulating circuit.

SUMMARY OF THE INVENTION

The invented signal compensation circuit includes an amplifier that receives and amplifies an input signal to generate an amplified signal. The amplifier has an adjustment terminal for adjusting the direct-current component of the amplified signal in response to an applied voltage. The applied voltage is generated as the voltage to which a capacitor in an integrating circuit is charged.

A low-speed compensation circuit detects changes in the direct-current component of the amplified signal and charges or discharges the capacitor accordingly, the charging and discharging taking place at a comparatively slow rate governed by the time constant of the integrating circuit.

A high-speed compensation circuit compares the amplified signal with an allowable amplitude range, and charges or discharges the capacitor in the integrating circuit at a comparatively rapid rate when the amplified signal goes outside the allowable amplitude range.

A threshold adjustment circuit detects changes in the amplitude of the amplified signal, and adjusts the allowable amplitude range in response to these changes, preferably by enlarging the allowable amplitude range when the amplified signal goes outside the allowable amplitude range.

The invention also provides a demodulating circuit including a detector, a comparator, and the invented signal compensation circuit. The amplifier in the signal compensation circuit amplifies a demodulated signal output from the detector. The comparator converts the amplified signal to a digital signal by comparing the amplified signal with a reference potential.

The invented demodulating circuit can compensate for DC offset rapidly through the action of the high-speed compensation circuit. The time constant of the integrating circuit can also be set to tolerate DC offset variations caused by runs of identical codes, without affecting the ability for rapid DC offset compensation.

If the allowable amplitude range is expanded when the amplified signal goes outside the allowable amplitude range, then a correct digital output signal can be obtained even if in-channel noise is superimposed on a run of identical codes in the desired signal.

BRIEF DESCRIPTION OF THE DRAWINGS

In the attached drawings:

FIG. 3 is a block diagram showing the internal structure of the amplitude detector in FIG. 1;

FIG. 10 shows waveforms illustrating the operation of the demodulating circuit in FIG. 1; and FIG. 11 shows waveforms illustrating the operation of the demodulating circuit in FIG. 1 when an in-channel interfering signal is present.

DETAILED DESCRIPTION OF THE INVENTION

An embodiment of the invention will be described with reference to the attached drawings.

Figure 1:
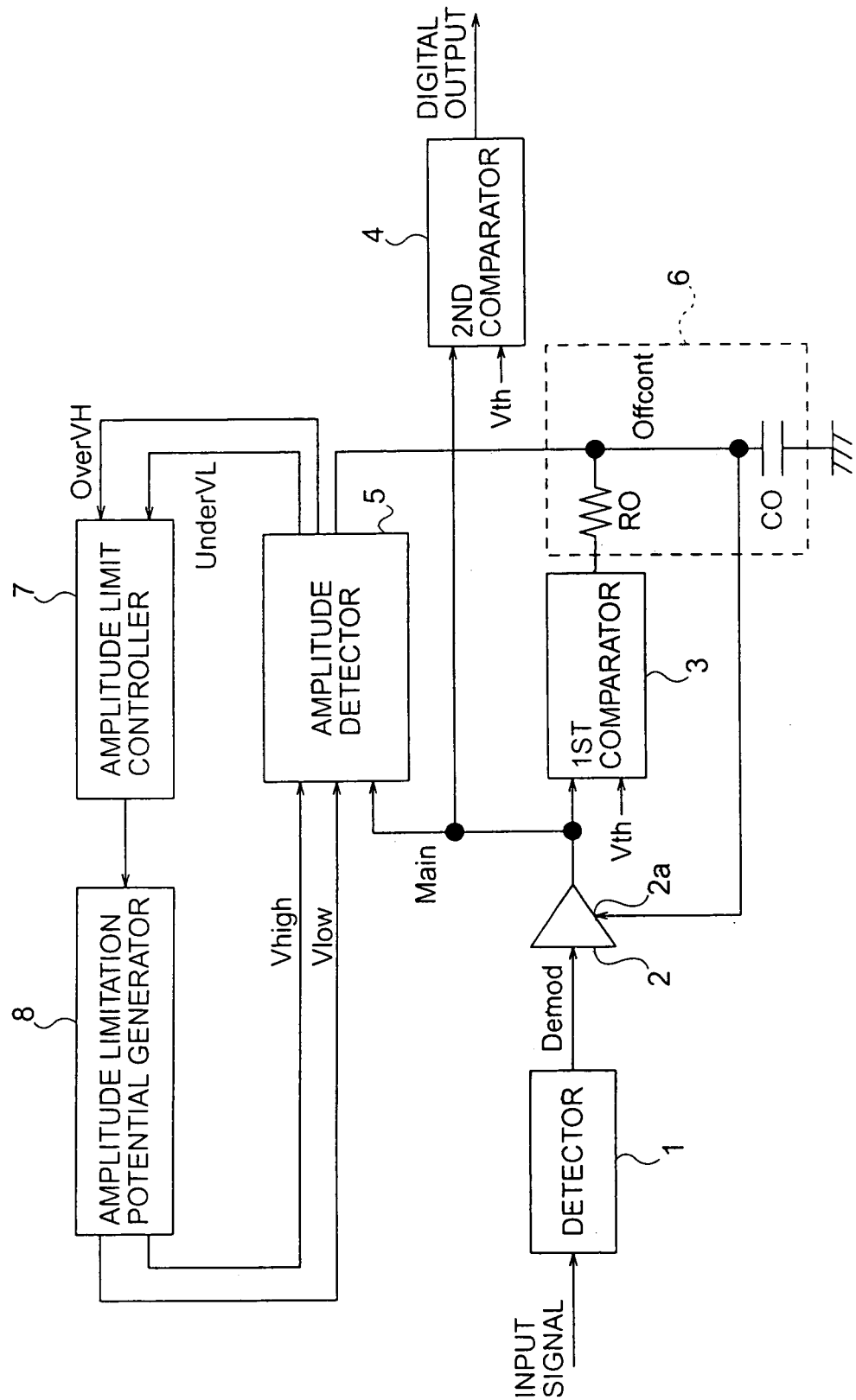
FIG. 1 is a block diagram showing the general structure of a demodulating circuit embodying the present invention.

Referring to FIG. 1, the demodulating circuit in the embodiment includes a detector 1, an amplifier 2, a first comparator 3, a second comparator 4, an amplitude detector 5, an integrating circuit 6, an amplitude limit controller 7, and an amplitude limitation potential generator 8. The integrating circuit 6 includes a resistor RO and a capacitor CO. The amplifier 2, first comparator 3, amplitude detector 5, resistor RO, capacitor CO, amplitude limit controller 7, and amplitude limitation potential generator 8 constitute a signal compensation circuit embodying the invention.

The detector 1 demodulates an input signal (an FSK signal, for example), and outputs the demodulated signal (the detected signal) as an analog signal to the amplifier 2.

The amplifier 2 amplifies the demodulated analog signal to an amplitude level adequate for operation of the comparators 3 and 4, and outputs the amplified signal (Main) to the first comparator 3, second comparator 4, and amplitude detector 5. The amplifier 2 has an adjustment terminal 2a, and offsets its output voltage (the voltage of the amplified demodulated signal Main) in response to the input at the adjustment terminal 2a, thereby adjusting the DC component of the amplified demodulated signal Main. The output voltage (Main voltage) of the amplifier 2 decreases when the voltage input to the adjustment terminal 2a increases, and increases when the voltage input to the adjustment terminal 2a decreases.

The first comparator 3 compares the voltage level of amplified demodulated signal Main with a reference potential, more specifically with a logic level threshold potential Vth. The output voltage of the first comparator 3 increases when the voltage of the amplified demodulated signal Main is higher than Vth, and decreases when the voltage of the amplified demodulated signal Main is lower than Vth.

The second comparator 4 also compares the voltage level of the amplified demodulated signal Main with the logic level threshold potential Vth, but provides the result of the comparison as a digital logic level signal (a CMOS level signal, for example); this digital signal is the output signal of the demodulating circuit.

As noted above, resistor RO and capacitor CO constitute an integrating circuit 6. Capacitor CO is charged and discharged through the input terminal of the integrating circuit 6 (one end of resistor RO), which is connected to the output terminal of the first comparator 3. The charge or discharge rate depends on the output voltage from the first comparator 3 and the resistance-capacitance time constant (RO×CO). The charge or discharge varies the potential of the node Offcont at which the resistor RO and capacitor CO are interconnected. Node Offcont is also connected to the output terminal of the amplitude detector 5, so its potential also varies due to charge and discharge as the amplitude detector 5 sources and sinks output current. The potential of node Offcont is applied to the adjustment terminal 2a of the amplifier 2.

The amplitude detector 5 receives the amplified demodulated signal Main from the amplifier 2, and receives a pair of amplitude limitation threshold potentials Vhigh and Vlow from the amplitude limit controller 7. These threshold potentials Vhigh and Vlow define an allowable amplitude range. When the amplified demodulated signal Main goes above the high threshold potential Vhigh, the amplitude detector 5 sources output current, thereby charging capacitor CO, and outputs an OverVH signal to the amplitude limit controller 7; the OverVH signal indicates that the amplifier output signal (Main) is above the allowable amplitude range. When the amplified demodulated signal Main goes below the low threshold potential Vlow, the amplitude detector 5 sinks output current, thereby discharging capacitor CO, and outputs an UnderVL signal to the amplitude limit controller 7; the UnderVL signal indicates that the amplifier output signal (Main) is below the allowable amplitude range. When the amplified demodulated signal Main is within the allowable amplitude range between Vlow and Vhigh, the amplitude detector 5 neither sources nor sinks output current, and the OverVH and UnderVL signals remain inactive.

The amplitude limit controller 7 receives the OverVH and UnderVL signals from the amplitude detector 5, generates control signals from the received signals, and controls the amplitude limitation potential generator 8.

The amplitude limitation potential generator 8 responds to the control signals from the amplitude limit controller 7 by controlling the potential difference between the two threshold potentials Vhigh and Vlow which it provides to the amplitude detector 5.

The amplifier 2, the first comparator 3, and the integrating circuit 6 constitute a negative feedback circuit that stabilizes the DC level of the amplified demodulated signal Main at the potential of the logic level threshold Vth. The tracking speed of this feedback circuit is determined by the time constant (RO×CO) of resistor RO and capacitor CO. Resistor RO and capacitor CO are selected to provide a time constant adequate for tracking low-speed DC offset variations.

The amplifier 2, the amplitude detector 5, and capacitor CO in the integrating circuit 6 also constitute a negative feedback circuit. This negative feedback circuit keeps the voltage of the amplified demodulated signal substantially within the range between the threshold potentials Vlow and Vhigh. The potential midway between the threshold potentials Vlow and Vhigh is the logic level threshold potential Vth. This negative feedback circuit does not include resistor RO within the feedback loop, so it responds quickly, by charging or discharging capacitor CO at a rapid rate, when the amplitude detector 5 detects that the amplified demodulated signal Main is outside the allowable amplitude range between the threshold potentials Vlow and Vhigh.

The demodulating circuit in FIG. 1 thus includes two feedback loops: the high-speed feedback loop responds to rapid signal variations and limits the amplitude of the amplified demodulated signal; the low-speed feedback loop tracks slow DC offset variations within the limited amplitude range. A feature of the demodulating circuit in FIG. 1 is that the threshold potentials Vlow and Vhigh at which high-speed negative feedback control is initiated are adjusted according to the amplitude of the amplified demodulated signal (Main) output from the amplifier 2.

Next, the basic operation of this demodulating circuit will be described.

The modulated input signal is first demodulated by the detector 1. The demodulated analog signal is amplified by the amplifier 2.

Even if the DC level of the demodulated signal (Demod) output from the detector 1 varies, the DC level of the output signal (Main) of the amplifier 2 is kept at the potential of the logic level threshold potential Vth as follows.

The output potential of the amplifier 2 (the voltage of the Main signal) is compared with the logic level threshold potential Vth by the first comparator 3. When the output potential (Main) is higher than the logic level threshold potential (Vth), capacitor CO is charged by the output of the first comparator 3 through resistor RO, and the integrated voltage (the potential of node Offcont) rises. The increased integrated voltage is input to the adjustment terminal 2a of the amplifier 2, which reduces the output potential. When the output potential (Main) is lower than the logic level threshold potential Vth, capacitor CO is discharged by the output of the first comparator 3 through resistor RO, and the integrated voltage falls. The decreased integrated voltage is input to the adjustment terminal 2a of the amplifier 2, which increases the output potential.

Constant repetitions of this type of negative feedback keep the output of the amplifier 2 (the amplified demodulated signal Main) centered on the logic level threshold potential Vth.

The amplitude of the demodulated signal output from the detector 1 may vary, but the amplitude of the amplified demodulated signal Main output from the amplifier 2 is kept within the range between the threshold potentials Vlow and Vhigh by high-speed negative feedback as described next. The high-speed negative feedback will first be explained as if the threshold potentials Vlow and Vhigh were fixed potentials.

The amplified demodulated signal Main is input to the amplitude detector 5 and compared with the threshold potentials Vlow and Vhigh.

When the potential of the Main signal is higher than the high threshold potential Vhigh, the amplitude detector 5 sources output current, charges capacitor CO directly, and rapidly increases the integrated voltage applied to the adjustment terminal 2a of the amplifier 2. The amplifier 2 responds by rapidly decreasing the Main potential. At the instant when the Main potential falls to (or just below) the high threshold potential Vhigh, the output current of the amplitude detector 5 is reduced to zero. The integrated voltage of capacitor CO then remains constant, leaving the Main potential near the Vhigh potential.

When the Main potential is lower than the low threshold potential Vlow, the amplitude detector 5 sinks output current, discharges capacitor CO directly, and rapidly decreases the integrated voltage applied to the adjustment terminal 2a of the amplifier 2. The amplifier 2 responds by rapidly increasing the Main potential. At the instant when the Main potential rises to (or just above) the low threshold potential Vlow, the output current of the amplitude detector 5 becomes zero. The integrated voltage of capacitor CO then remains constant, leaving the Main potential near the Vlow potential.

When the Main potential is within the range between the threshold potentials Vlow and Vhigh, the output current of the amplitude detector 5 remains zero and neither charges nor discharges capacitor CO.

Thus the voltage of the amplified demodulated signal Main varies within the allowable amplitude range between the threshold potentials Vlow and Vhigh, but the variations are kept centered on the logic level threshold potential Vth at the center of this range. In the second comparator 4, the amplified demodulated signal Main is compared with Vth to generate a logic level signal, which becomes the digital output signal of the demodulating circuit.

The high-speed negative feedback loop has been provisionally described as if the threshold potentials Vlow and Vhigh were fixed potentials, but the amplitude limit controller 7 and the amplitude limitation potential generator 8 function so as to vary the threshold potentials Vlow and Vhigh in response to variations in the voltage amplitude of the amplified demodulated signal Main. More specifically, the amplitude limit controller 7 and the amplitude limitation potential generator 8 control the potential difference between the threshold potentials Vlow and Vhigh, while keeping the range between Vlow and Vhigh centered on the logic threshold potential Vth.

Figure 2A:
FIG. 2A shows a waveform of an in-channel interfering signal.
Figure 2B:
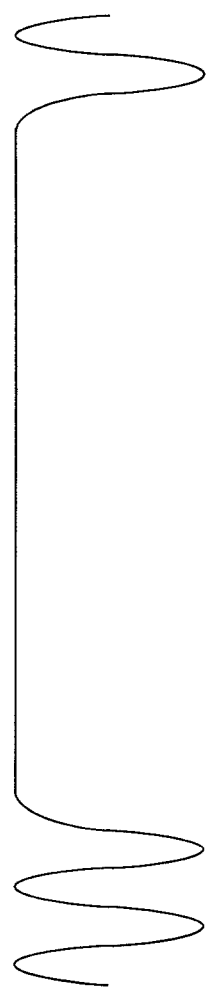
FIG. 2B shows a waveform of a desired signal.
Figure 2C:
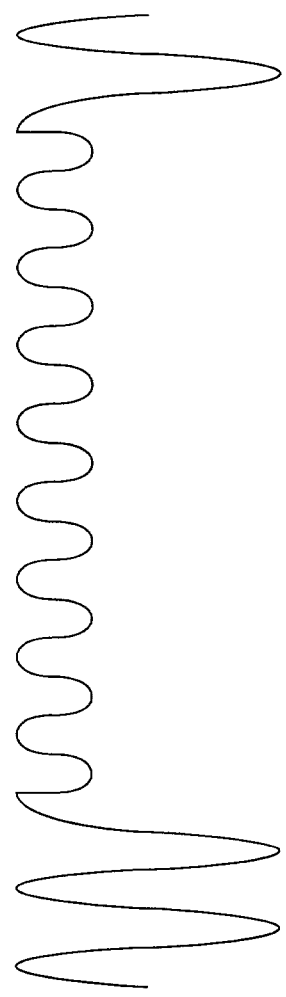
FIG. 2C shows a combined waveform of the in-channel interfering signal and the desired signal.
Figure 2D:
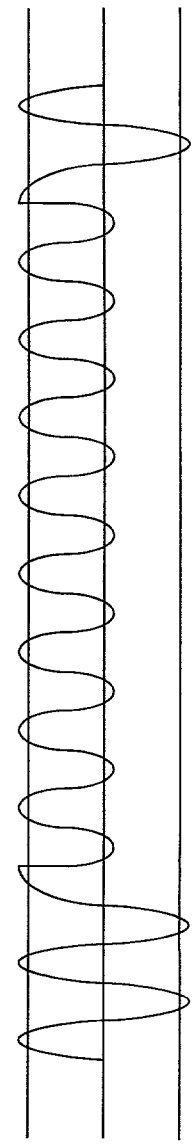
FIG. 2D shows an amplitude-limited combined waveform.
Figure 2E:
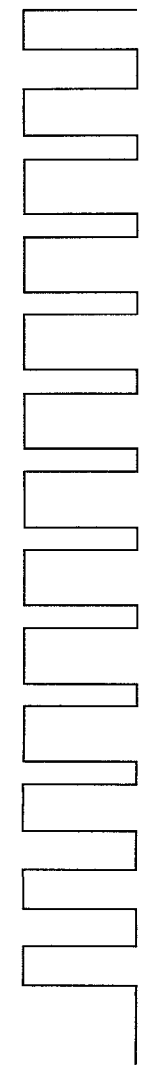
FIG. 2E shows the corresponding digital output signal.
Figure 2F:
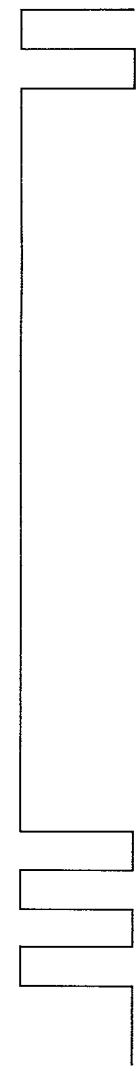
FIG. 2F shows the desired digital output signal.

The reason for controlling the threshold potentials Vlow and Vhigh is that if Vlow and Vhigh were fixed potentials, there would be a possibility of incorrect output from the second comparator 4. This possibility would occur when an in-channel interfering signal such as shown in FIG. 2A, having the same frequency as the desired signal shown in FIG. 2B, was superimposed on the desired signal, so that the arriving signal had a waveform such as the one shown in FIG. 2C. If Vlow and Vhigh were fixed potentials, the high-speed negative feedback function (amplitude limitation function) described above could operate so as to make the amplifier 2 output the demodulated signal shown in FIG. 2D, in which case the second comparator 4 would generate an incorrect digital output signal as shown in FIG. 2E instead of the correct signal shown in FIG. 2F.

Fixing Vlow and Vhigh at potentials with a large potential difference between them could prevent an in-channel interfering signal superimposed on the desired signal from causing this problem. The large potential difference, however, would impair high-speed compensation for DC offset variations in the demodulated signal output from the detector 1.

That is the reason why the negative feedback loop in the embodiment includes the amplitude limit controller 7 and the amplitude limitation potential generator 8, and the amplitude limit controller 7 and the amplitude limitation potential generator 8 function so as to vary the threshold potentials Vlow and Vhigh in response to variations of the voltage amplitude of the amplified demodulated signal Main.

Details of the control of the threshold potentials Vlow and Vhigh will be described below.

First, the detailed configuration and operation of the amplitude detector 5 will be explained with reference to FIGS. 3 and 4.

Referring to FIG. 3, the amplitude detector 5 has two comparator circuits Comp1 and Comp2, a p-channel metaloxide-semiconductor (PMOS) transistor M11, and an n-channel metal-oxide-semiconductor (NMOS) transistor M12.

The source terminal and drain terminal of PMOS transistor M11 are connected in series with the source terminal and drain terminal of NMOS transistor M12 between a power supply terminal Vdd (=2×Vth) and ground. PMOS transistor M11 and NMOS transistor M12 are provided as switching transistors. The drain terminals of PMOS transistor M11 and NMOS transistor M12 are both connected to the node Offcont at which the resistor RO and capacitor CO of the integrating circuit 6 are interconnected.

When PMOS transistor M11 is turned on and NMOS transistor M12 is turned off, the amplitude detector 5 sources charging current to the integrating circuit 6. When PMOS transistor M11 is turned off and NMOS transistor M12 is turned on, the amplitude detector 5 sinks discharging current from the integrating circuit 6. When both PMOS transistor M11 and NMOS transistor M12 are turned off, the amplitude detector 5 neither sources charging current to nor sinks discharging current from the integrating circuit 6.

Comparator circuit Comp1 controls the switching of PMOS transistor M11, and comparator circuit Comp2 controls the switching of NMOS transistor M12.

Comparator circuit Comp1 receives the high threshold potential Vhigh at its non-inverting input terminal, and the amplified demodulated signal Main at its inverting input terminal. When the amplified demodulated signal Main is higher than the high threshold potential Vhigh, comparator circuit Comp1 turns on PMOS transistor M11. The output terminal of comparator circuit Comp1 is connected to both the gate electrode of PMOS transistor M11 and the OverVH signal input terminal of the amplitude limit controller 7.

Comparator circuit Comp2 receives the low threshold potential Vlow at its non-inverting input terminal, and the amplified demodulated signal Main at its inverting input terminal. When the amplified demodulated signal Main is lower than the low threshold potential Vlow, comparator circuit Comp2 turns on NMOS transistor M12. The output terminal of comparator circuit Comp2 is connected to both the gate electrode of NMOS transistor M12 and the UnderVL signal input terminal of the amplitude limit controller 7.

Figure 4:
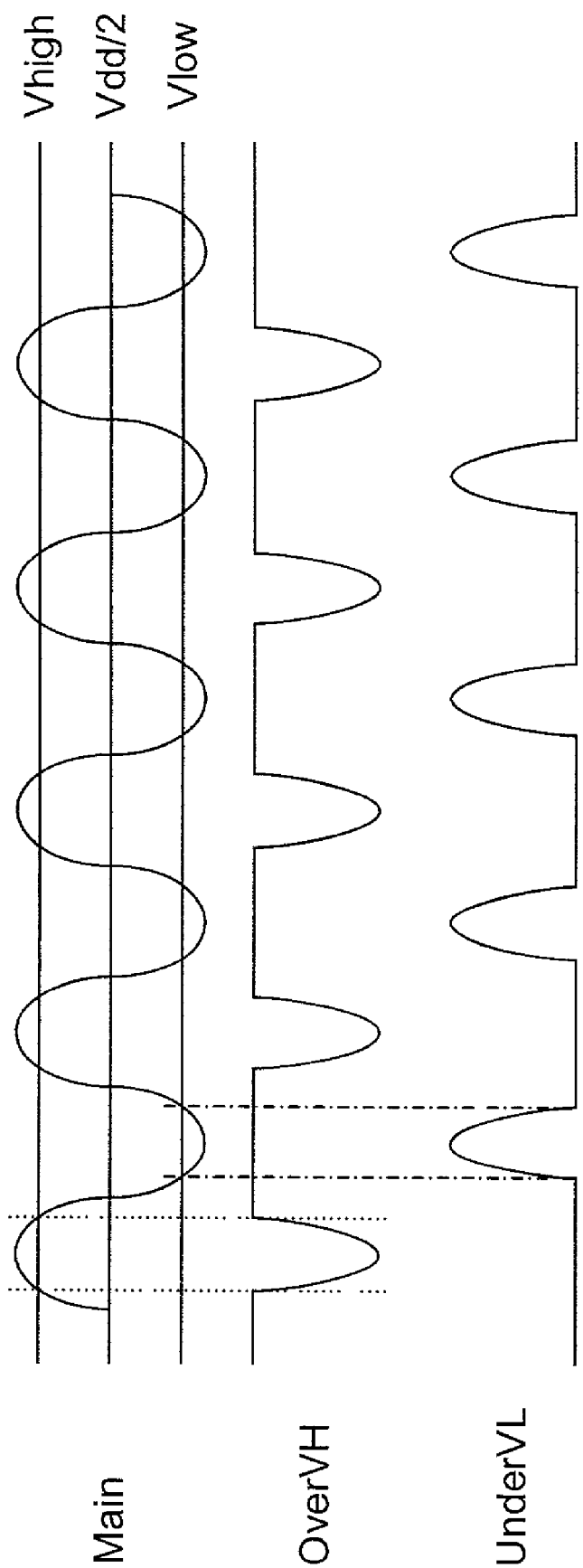
FIG. 4 shows waveforms of signals in FIG. 3.

Input of the demodulated signal Main shown in FIG. 4 to the inverting input terminals of comparator circuits Comp1 and Comp2 produces the waveforms of the OverVH and UnderVL signals shown in FIG. 4.

Next, the detailed configuration and operation of the amplitude limit controller 7 will be explained with reference to FIGS. 5 and 6.

Figure 5:
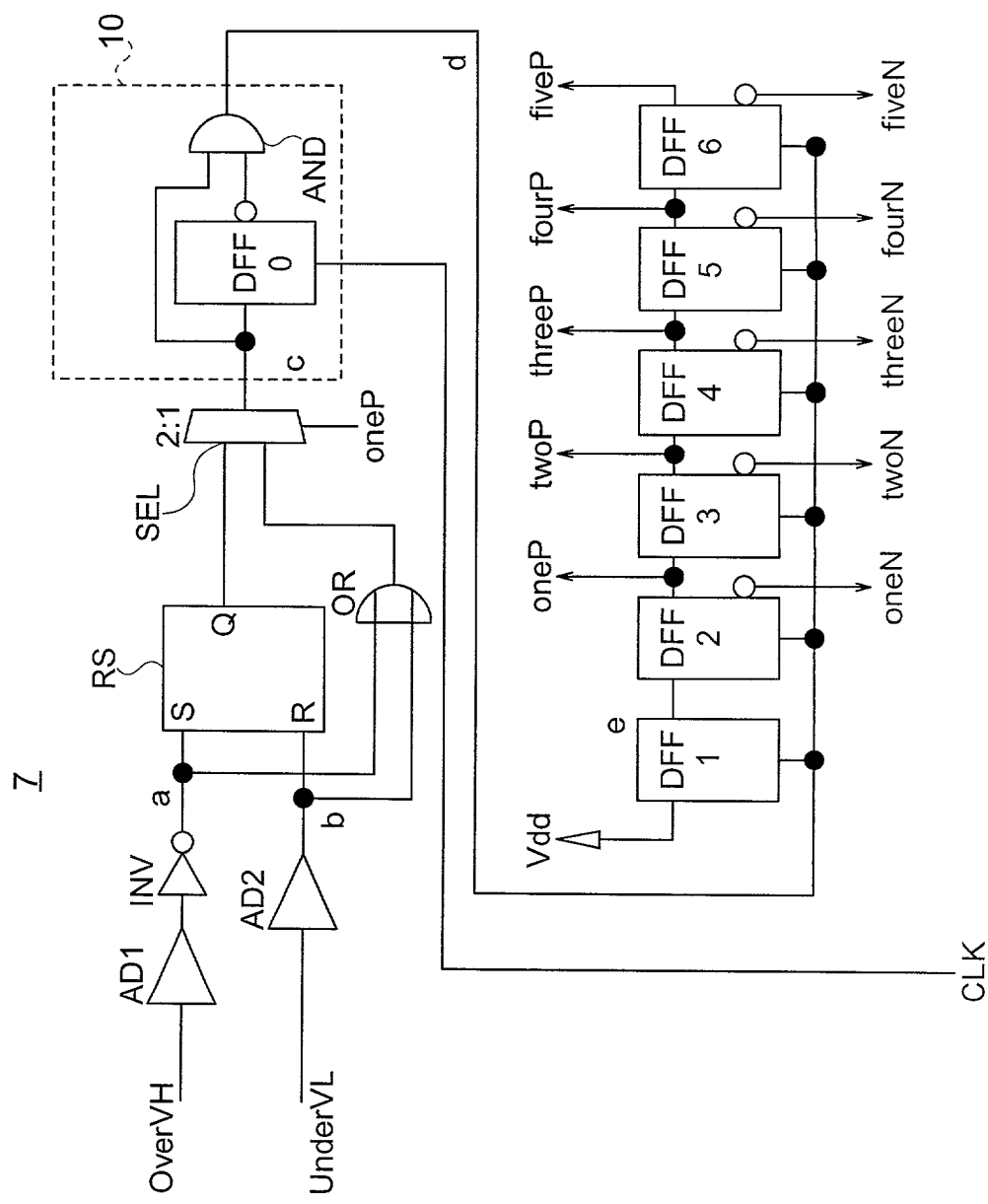
FIG. 5 is a block diagram showing the internal structure of the amplitude limit controller in FIG. 1.

Referring to FIG. 5, the amplitude limit controller 7 has two one-bit analog-to-digital (A/D) converter circuits AD1 and AD2, an inverting buffer INV, a set-reset flip-flop RS, a logical OR gate, a 2:1 selector circuit SEL, a rising transition detector 10, and six D-type flip-flops DFF1–DFF6.

A/D converter circuit AD1 converts the OverVH signal input from the amplitude detector 5 to a digital logic level signal. Inverting buffer INV inverts the logic level output from A/D converter circuit AD1, and provides the inverted signal to the set (S) input terminal of set-reset flip-flop RS and to one of the two input terminals of the logical OR gate. A/D converter circuit AD2 converts the UnderVL signal input from the amplitude detector 5 to a digital logic level signal, and provides the converted signal to the reset (R) input terminal of set-reset flip-flop RS and to the other input terminal of the logical OR gate.

When an active digital signal (a signal at the high logic level) arrives at set-reset flip-flop RS from inverting buffer INV, the non-inverting output terminal Q of set-reset flip-flop RS goes to the high logic level. When an active (high) digital signal arrives at set-reset flip-flop RS from A/D converter circuit AD2, the non-inverting output terminal Q of set-reset flip-flop RS goes to the low logic level. The Q output signal from set-reset flip-flop RS is provided to one of the input terminals of 2:1 selector circuit SEL. The logical OR gate supplies the logical OR of the digital signals output from inverting buffer INV and A/D converter circuit AD2 to the other input terminal of 2:1 selector circuit SEL.

The non-inverting output signal oneP from D-type flip-flop DFF2 is provided as a selection control signal to selector circuit SEL. When this signal oneP is at the low logic level, selector circuit SEL selects the output signal of set-reset flip-flop RS. When oneP is at the high logic level, selector circuit SEL selects the output signal of the logical OR gate. The signal selected by selector circuit SEL is output to the rising transition detector 10.

The rising transition detector 10, as shown in FIG. 5, includes a D-type flip-flop DFF0 and a logical AND gate. The rising transition detector 10 detects the rise of the output signal from selector circuit SEL, forms a detection signal having a pulse width equal to one cycle of a high-speed clock signal CLK, and provides the detection signal to the clock input terminals of D-type flip-flops DFF1–DFF6. The frequency of the clock signal CLK (12 MHz, for example) is well above the highest transmitted signal speed (1 Mbps, for example) specified for the wireless communication system being used.

D-type flip-flops DFF1-DFF6 are cascaded as a shift register. The data input terminal of the first D-type flip-flop DFF1 is tied to the high logic level (Vdd). Each time the shift operation is repeated, the number of D-type flip-flops holding the high logic level increases. The non-inverted output signals oneP–fiveP and the inverted signals oneN–fiveN of D-type flip-flops DFF2-DFF6 are provided to the amplitude limitation potential generator 8 as the control signals mentioned above. All D-type flip-flops DFF1–DFF6 are placed at the low logic level before the demodulating circuit begins demodulating (detecting) the input signal. This occurs because, for example, a reset signal is input to the reset input terminals (not shown) of the flip-flops.

Next, the operation of the amplitude limit controller 7 will be explained with reference to the timing diagram in FIG. 6. The waveforms identified by the letters 'a' to 'e' in FIG. 6 are observed at the corresponding points in FIG. 5.

The OverVH and UnderVL signals input from the amplitude detector 5 are converted to digital logic level signals by one-bit A/D converter circuits AD1 and AD2, respectively. After the OverVH signal is converted to a digital logic level signal by one-bit A/D converter circuit AD1, its logic polarity is inverted by the inverting buffer INV, so that its active logic polarity is equal to that of the UnderVL signal (see waveforms 'a' and 'b' in FIG. 6). When the OverVH signal is input, set-reset flip-flop RS goes to the high logic level, and when the UnderVL signal is input, set-reset flip-flop RS goes to the low logic level. A low-to-high transition of the output of set-reset flip-flop RS normally indicates that the amplified demodulated signal Main has first gone below threshold potential Vlow and then gone above threshold potential Vhigh, indicating that the amplitude of the amplified demodulated signal Main is greater than the width of the allowable amplitude range.

When either the OverVH signal or the UnderVL signal is input to the logical OR gate, the output of the logical OR gate goes to the high logic level. A low-to-high transition of the output of the logical OR gate indicates that the amplified demodulated signal Main has moved from within the allowable amplitude range between the threshold potentials Vhigh and Vlow to a point outside that range, either above Vhigh or below Vlow.

Figure 6:
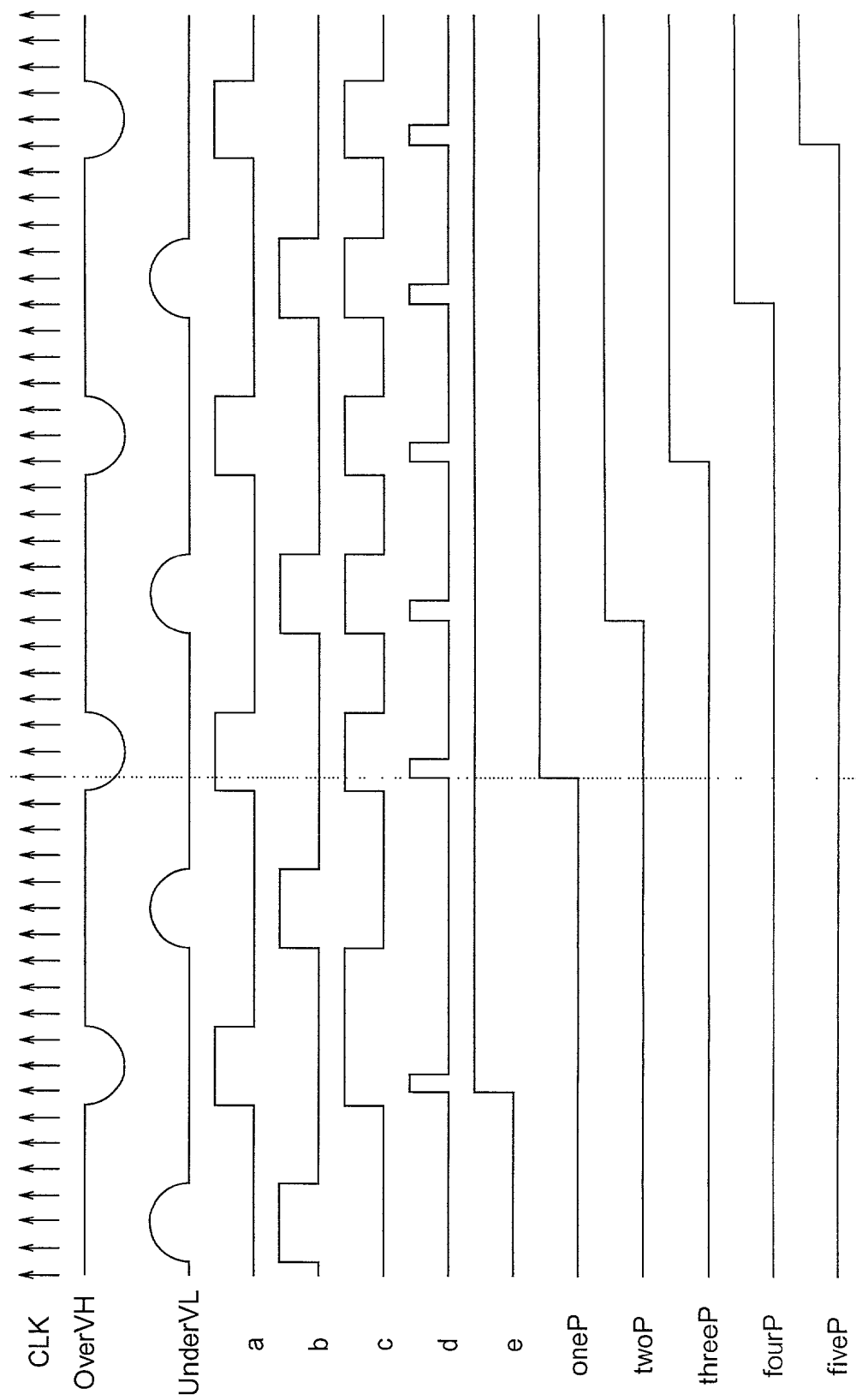
FIG. 6 is a timing diagram showing waveforms of signals in FIG. 5.

The selector circuit SEL selects the output of either set-reset flip-flop RS or the logical OR gate (waveform 'c' in FIG. 6). The selection operation is controlled by the output (oneP) of D-type flip-flop DFF2. When oneP is at the high logic level, the output of the logical OR gate is selected. When oneP is at the low logic level, the output of set-reset flip-flop RS is selected.

Operating at the frequency of clock signal CLK (12 MHz, for example), which is well above the highest transmitted signal speed (1 Mbps, for example) specified for the wireless communication system being used, the rising transition detector 10 detects the rise of the output of either set-reset flip-flop RS or the logical OR gate, as selected by selector circuit SEL, and thereby generates a pulse waveform ('d' in FIG. 6). Even if the OverVH and UnderVL signals arrive extremely close together, they are separated by approximately one cycle of the highest transmitted signal speed specified for the wireless communication system, so the pulses in the 'd' waveform are widely enough separated to prevent D-type flip-flops DFF1–DFF6 from operating incorrectly.

The output of the rising transition detector 10 is input to the clock input terminals of D-type flip-flops DFF1–DFF6. D-type flip-flops DFF1–DFF6 constitute a shift register, so the logic levels held in them are shifted in order from DFF1 to DFF6 (waveforms 'e' and oneP to fiveP in FIG. 6) in synchronization with the output of selector circuit SEL (waveform 'c'). The first D-type flip-flop DFF1 is inserted as a protection stage, to ensure that the first input of the OverVH signal will not cause a low-to-high transition of the output of the second D-type flip-flop DFF2 (oneP), even if set-reset flip-flop RS initially holds the low logic level.

The output of the second D-type flip-flop DFF2 (oneP) is initially at the low logic level, selecting the output of set-reset flip-flop RS. The DFF2 output (oneP) does not go high until the output of set-reset flip-flop RS has gone from the low logic level to the high logic level twice. This cannot occur unless the amplified demodulated signal Main has crossed both of the amplitude limitation potentials Vhigh and Vlow of the amplitude detector, indicating that the amplitude of the amplified demodulated signal Main is definitely greater than the allowable limit. This feature makes DC offset compensation of the output of the amplifier 2 more reliable by avoiding unnecessary adjustment of the amplitude limitation threshold potentials.

After the second low-to-high transition of the output of set-reset flip-flop RS, the output of the second D-type flip-flop DFF2 (oneP) goes high, selecting the output of the logical OR gate. The rising transition detector 10 now generates one pulse each time either the OverVH or the UnderVL signal is input, that is, each time the amplified demodulated signal Main goes either above threshold potential Vhigh or below threshold potential Vlow.

Triggered by the input of the OverVH and UnderVL signals from the amplitude detector 5, the amplitude limit controller 7 outputs the oneP–fiveP and oneN–fiveN signals to the amplitude limitation potential generator 8. The number of signals among oneP–fiveP that are at the high logic level increases sequentially.

Next, the detailed configuration and operation of the amplitude limitation potential generator 8 will be explained with reference to FIGS. 7, 8A, and 8B.

Figure 7:
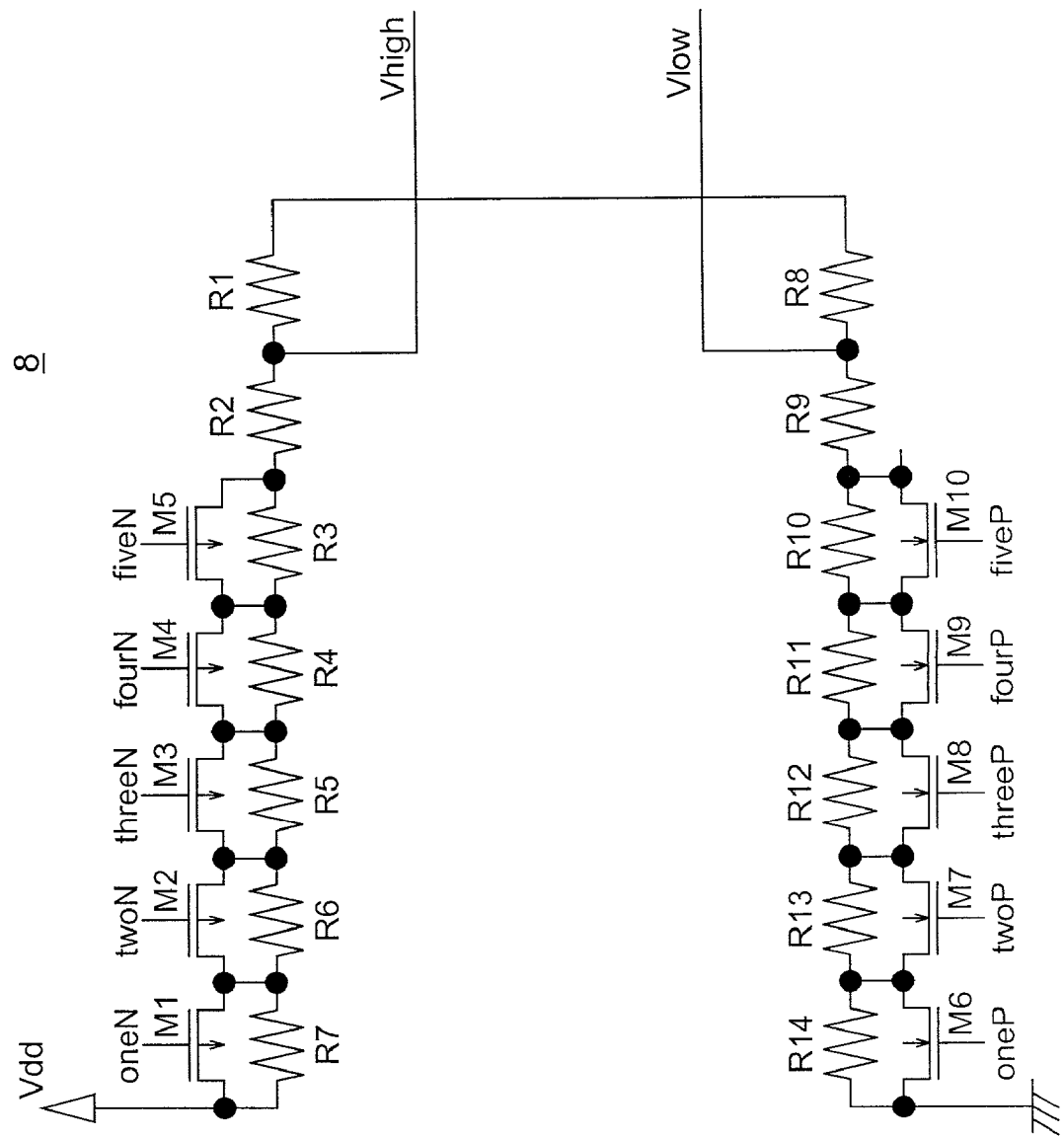
FIG. 7 is a block diagram showing the internal structure of the amplitude limitation potential generator in FIG. 1.
Figure 8:
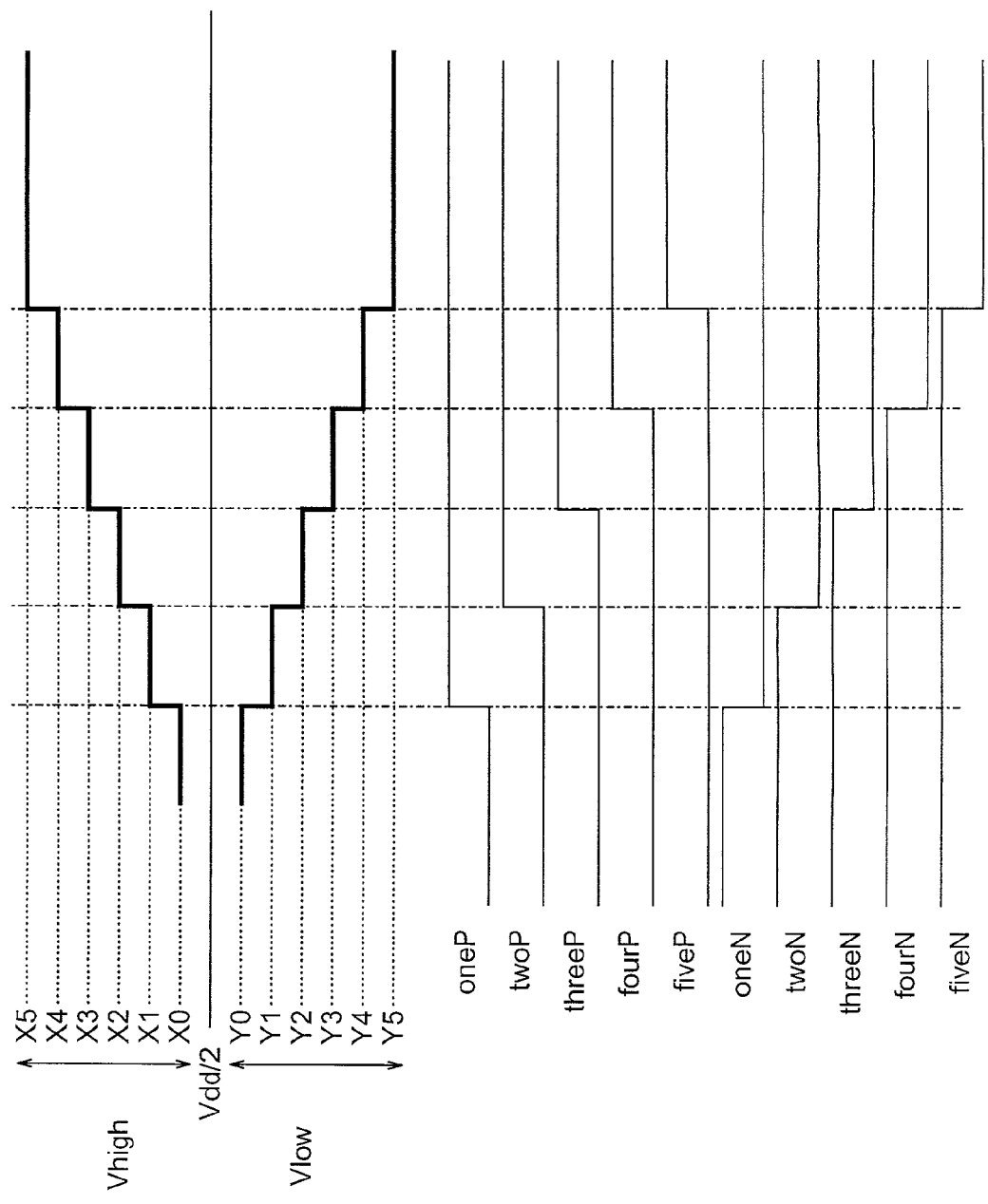
FIG. 8A is a timing diagram showing waveforms of signals in FIG. 7.
FIG. 8B shows formulas for values appearing in FIG. 8A.

Referring to FIG. 7, the amplitude limitation potential generator 8 has fourteen resistors R1–R14, five PMOS transistors M1–M5, and five NMOS transistors M6–M10. The fourteen resistors are connected in series between the power-supply voltage Vdd and ground, in order from R7 to R1, then from R8 to R14, as seen from Vdd.

Resistors R7–R3 are connected in parallel with switching PMOS transistors M1–M5, respectively. When PMOS transistors M1–M5 are turned on, the corresponding resistors R7–R3 are short-circuited. Signals oneN–fiveN from the amplitude limit controller 7 are provided to the gate electrode of PMOS transistors M1–M5.

In a manner similar to resistors R7–R3, resistors R14–R10 are connected in parallel with respective switching NMOS transistors M6–M10. When NMOS transistors M6–M10 are turned on, resistors R14–R10 are short-circuited. Signals oneP–fiveP from the amplitude limit controller 7 are provided to the gate electrode of NMOS transistors M6–M10.

As can be understood from the explanation of the amplitude limit controller 7, oneN and oneP are complementary signals, so when PMOS transistor M1 is turned on, NMOS transistors M6 is also turned on. The other PMOS transistors and NMOS transistors are similarly turned on in pairs.

The potential of the node at which resistors R2 and R1 are interconnected is provided to the amplitude detector 5 as the high threshold potential (upper amplitude limitation potential) Vhigh. The potential of the node at which resistors R8 and R9 are interconnected is also provided to the amplitude detector 5 as the low threshold potential (lower amplitude limitation potential) Vlow.

The resistance values of resistors R1–R14 are related as follows.

$$R=R8, R2=R9, R3=R10, R4=R11, R5=R12, R6=R13, R7=R14 \quad (1)$$

Next, the operation of the amplitude limitation potential generator 8 will be explained with reference to the timing diagram in FIG. 8A.

Initially, signals oneP–fiveP are placed at the low logic level, signals oneN–fiveN are placed at the high logic level, and all NMOS transistors M6–M10 and all PMOS transistors M1–M5 are in the off-state (the non-conducting state). The threshold potentials Vhigh and Vlow are therefore resistor voltage-divider potentials determined by the power-supply potential Vdd and the resistance values of resistors R1–R14 as follows. In equation (2) the summation in $\Sigma Rn$ is over values of n from 1 to 7.

$$V\text{high}=(Vdd/2)\times\{1+(R1/(\Sigma Rn))\} \quad (2)$$

$$V\text{low}=Vdd-V\text{high} \quad (3)$$

Next, when oneP goes to the high logic level and oneN simultaneously goes to the low logic level, PMOS transistor M1 and NMOS transistor M6 turn on (conduct), short-circuiting resistors R7 and R14. The threshold potentials Vhigh and Vlow are now the resistor voltage-divider potentials determined by the source potential Vdd and the resistance values of resistors R1–R6 and R8–R13 as follows. In equation (4) the summation in $\Sigma Rn$ is over values of n from 1 to 6.

$$V\text{high}=(Vdd/2)\times\{1+(R1/(\Sigma Rn))\} \quad (4)$$

$$V\text{low}=Vdd-V\text{high} \quad (5)$$

As signals oneP to fiveP successively go (and remain) high and signals oneN to fiveN successively go (and remain) low, the number of PMOS transistors and NMOS transistors that are turned on (are in the conducting state) increases. The threshold potentials Vhigh and Vlow vary according to the number of PMOS transistors and NMOS transistors that are turned on as shown in FIGS. 8A and 8B. If the number of PMOS transistors that are turned on is m (where m is an integer from 0 to 5) and the number of NMOS transistors that are turned on is likewise m, the threshold potentials Vhigh and Vlow are given by the following equations. In equation (6), the summation in ΣRn is over values of n from 1 to (7−m).

$$V\text{high} = (Vdd/2) \times \{1 + (R1/(\Sigma Rn))\} \quad (6)$$

$$V\text{low} = Vdd - V\text{high} \quad (7)$$

In response to the output of the amplitude limit controller 7, the amplitude limitation potential generator 8 sequentially expands the potential difference between the threshold potentials Vhigh and Vlow of the amplitude detector 5, centered on Vdd/2.

Figure 9:
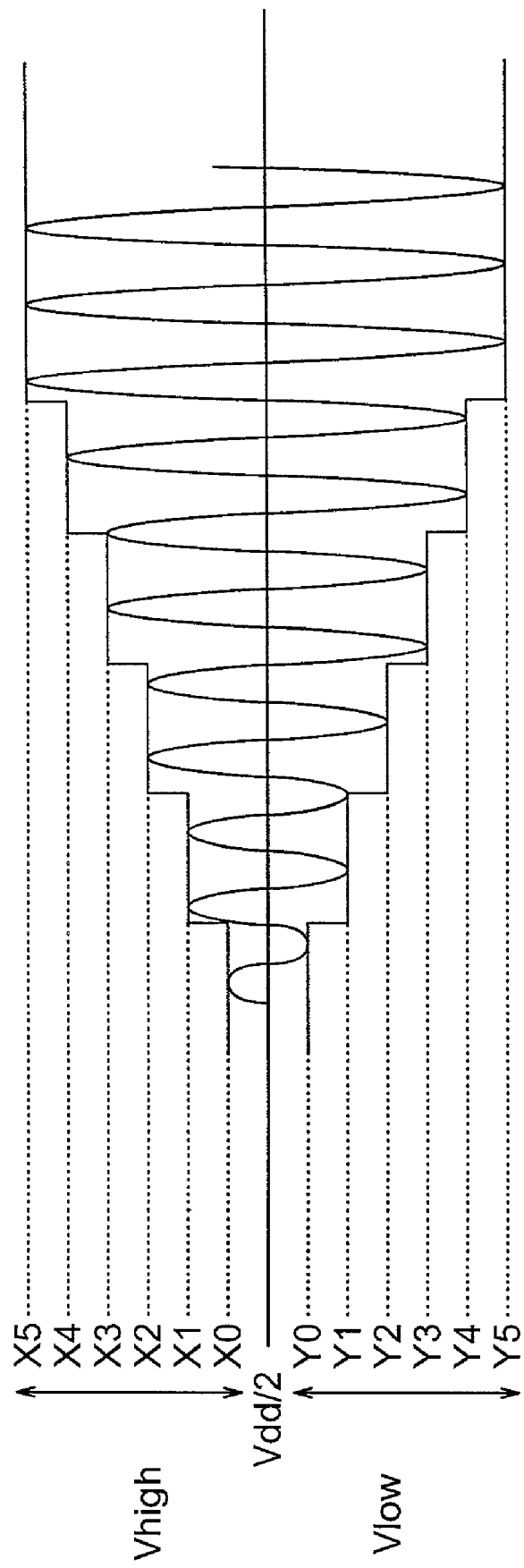
FIG. 9 shows waveforms illustrating the relationship between the input signal to the amplitude detector in FIG. 1 and the amplitude limitation potentials.

The amplitude detector 5, the amplitude limit controller 7, and the amplitude limitation potential generator 8, which have been explained in detail above, operate so that the threshold potentials Vhigh and Vlow increase (Vhigh) and decrease (Vlow) by steps as shown in FIG. 9, according to the amplitude of the amplified demodulated signal Main. A maximum of five expansion steps are possible. Expansion stops when the amplified demodulated signal Main can be accommodated between the threshold potentials Vhigh and Vlow without further need for high-speed negative feedback control.

Next, a first example of the operation of the demodulating circuit will be described with reference to FIG. 10, assuming the above detailed structure of the amplitude detector 5, the amplitude limit controller 7, and the amplitude limitation potential generator 8.

Some parts of the first operation of the demodulating circuit duplicate the basic operation explained earlier, so these parts will be described only briefly, or descriptions will be omitted. The logic level threshold potential Vth is the potential Vdd/2 midway between the amplitude limitation potentials Vhigh and Vlow. The initial potential difference between the amplitude limitation potentials Vhigh and Vlow is preset at the minimum amplitude of the desired signal after demodulation by the detector 1.

At time t=0 in FIG. 10, when the desired signal begins to arrive, the DC potential of the signal Demod detected by the detector 1, shown at the top in FIG. 10, may include a dynamic variable offset due to, for example, the effect of a difference between the signal frequency and the predetermined carrier frequency. It will be assumed that the DC offset is a downward offset. The output signal Demod of the detector 1 is amplified linearly by the amplifier 2 and input to the first comparator 3, the second comparator 4, and the amplitude detector 5. If the DC offset causes the output signal Main of the amplifier 2 to fall below the low threshold potential Vlow which is input to the amplitude detector 5, capacitor CO is rapidly discharged. During this period TD of discharge due to high-speed negative feedback, the DC level of the output signal Main of the amplifier 2 rises steeply, and the Main signal is quickly compensated upward to the low threshold potential Vlow, as shown in FIG. 10.

The alternating-current (AC) component of the desired signal in the output Demod of the detector 1 then brings the output Main of the amplifier 2 to the high threshold potential Vhigh. The output of set-reset flip-flop RS in the amplitude limit controller 7 goes high, but the amplitude limit controller 7 does not immediately change the amplitude limitation potentials, because of the protection stage noted above. As soon as the output signal Main of the amplifier 2 exceeds the high threshold potential Vhigh, the amplitude detector 5 rapidly charges capacitor CO. As a result, the potential of the output signal Main of the amplifier 2 is quickly lowered, so that it does not rise very far above the high threshold potential Vhigh.

The AC component of the desired signal then brings the output signal Main of the amplifier 2 back to the low threshold potential Vlow. Due to the protection feature, the amplitude limit controller 7 still does not change the low threshold potential Vlow, and high-speed negative feedback raises the potential of the output signal Main of the amplifier 2 quickly, so that does not fall very far below the low threshold potential Vlow. At this point in the operation, the output of set-reset flip-flop RS in the amplitude limit controller 7 is at the low logic level.

At the instant when the output signal Main of the amplifier 2 arrives at the high threshold potential Vhigh again, the output of set-reset flip-flop RS in the amplitude limit controller 7 goes to the high logic level for a second time, indicating that the amplified demodulated signal Main has crossed the threshold potentials Vhigh and Vlow at least once each. The amplitude limit controller 7 then begins controlling the amplitude limitation potentials by activating signal oneP in FIG. 10, thereby expanding the allowable amplitude range. This causes a first-stage increase in the difference between the threshold potentials Vhigh and Vlow.

The AC component of the desired signal continues to drive the output signal Main of the amplifier 2 above the high threshold potentials Vhigh and below the low threshold potentials Vlow, each time causing the difference between the threshold potentials Vhigh and Vlow to be increased again. The amplitude limit controller 7 keeps expanding the potential difference until the amplitude of the output signal Main of the amplifier 2 fits within the range between Vhigh and Vlow. In FIG. 10, this occurs when the potential difference between Vhigh and Vlow has been increased three times.

In this state, if a run of identical codes (such as the high-level run beginning at time t=t1 in FIG. 10) occurs in the output signal Demod of the detector 1, since the output signal Main of the amplifier 2 stays between the threshold potentials Vhigh and Vlow, the amplitude detector 5 neither charges nor discharges capacitor CO rapidly. The low-speed negative feedback control loop involving the first comparator 3, resistor RO, and capacitor CO, operating with the time constant τ (RO×CO), shifts the output signal Main of the amplifier 2 toward the potential Vdd/2 (=Vth), as shown in FIG. 10, but the time constant τ is set so as to ensure correct operation over runs of identical codes up to the run length specified for the application wireless communication system.

At the end of the run, when the AC component of the output signal Demod of the detector 1 reappears, the output signal Main of the amplifier 2 goes below the low threshold potential Vlow, so the difference between the threshold potentials Vhigh and Vlow is increased again (at time t=t2 in FIG. 10). Constant repetitions of low-speed negative feedback then keep the DC potential of the output signal Main centered on the logic level threshold potential Vdd/2 of the first comparator 3.

Next, a second example of the operation will be described with reference to FIG. 11. In this example, an in-channel interfering signal (waveform A), having the same frequency as the desired signal, is superimposed on the desired signal (waveform B). The output signal Demod of the detector 1 (waveform C) includes both the desired signal and the superimposed in-channel interfering signal.

From the start of reception of the desired signal up to time t=t1 in FIG. 11, high-speed DC offset compensation and the operation of expanding the potential difference between the amplitude limitation potentials Vhigh and Vlow are carried out (waveform D) according to the output (Main) of the amplifier 2 as explained in the preceding example.

At time t=t1, the difference between the amplitude limitation potentials has been expanded to accommodate the amplitude of the amplified demodulated signal Main, which includes both the amplitude of the desired signal and the amplitude of the superimposed interfering signal. Specifically, by time t=t1 the allowable amplitude range has been expanded four times (in FIG. 10, it was expanded only three times). As a result, during the identical-code run that begins after time t=t1, the interfering signal superimposed on the desired signal does not cross the logic level threshold potential Vdd/2 of the second comparator 4, and the correct digital output signal is obtained (waveform E).

The demodulating circuit in the embodiment described above includes two independent negative feedback loops: DC offset compensation of the demodulated signal is executed in a low-speed negative feedback loop involving an integrating circuit comprising a resistor and a capacitor; amplitude limitation of the demodulated signal is executed in a high-speed negative feedback loop in which the voltage amplitude of the demodulated signal is detected and the capacitor is rapidly charged or discharged according to the result. The capability for rapid DC offset compensation is determined by the rate at which the high-speed negative feedback loop can charge and discharge the capacitor; in the embodiment above this rate is determined by the current handling capability of the amplitude detector 5 (e.g., by the dimensions of transistors M11 and M12 in FIG. 3). Tolerance for runs of identical codes is determined by the time constant of the integrating circuit, as given by the resistance and capacitance values of resistor RO and capacitor CO. The capability to compensate for rapid shifts in DC offset and the capability to tolerate long runs of identical codes can therefore be provided simultaneously, in an independent and flexible manner, by appropriate choice of resistance and capacitance values and current handling capabilities.

Another feature of the demodulating circuit is its control of the two amplitude limitation threshold potentials in response to the amplitude of the demodulated signal, so that when the amplitude of the demodulated signal is increased by a superimposed in-channel interfering signal, the amplitude limits can be expanded to accommodate the increased signal amplitude. This feature prevents errors in the digital output signal by preventing unnecessary triggering of the high-speed DC offset compensation function.

A further feature of the demodulating circuit is the protection function provided in the amplitude limit controller 7, which delays control of the amplitude limitation threshold potentials until the demodulated signal has been detected to definitely cross both the high and low threshold potentials. This feature improves the reliability of DC offset compensation of the demodulated signal.

The invented demodulating circuit has been described as being used in a wireless communication system, but it is also useful in other systems, such as optical transmission systems, particularly in systems that receive signals in bursts.

Various circuit blocks in the demodulating circuit have been described as using MOS transistors, but similar circuit functions can be provided with other types of unipolar transistors, or with bipolar transistors or other devices.

In the above description of the operation of the demodulating circuit, the allowable amplitude range was expandable in five steps, but the invention is of course not limited to five steps; there can be any number of steps.

The amplitude limit controller 7 in the demodulating circuit described above included a rising transition detector 10, but a circuit that detects falling (high-to-low) transitions can be used instead.

The amplitude limit controller 7 in the demodulating circuit described above only expanded the difference between the two amplitude limitation potentials, but the amplitude limit controller 7 may also operate so as to narrow the difference between the two amplitude limitation potentials. For example, if the output signal Main of the amplifier 2 does not cross the amplitude limitation potentials for more than a predetermined time, the difference between the two amplitude limitation potentials can be decreased by one step.

The demodulating circuit described above provides a protection function only for the first-step expansion of the allowable amplitude range, but similar protection can be provided for the succeeding expansion steps.

The present invention is characterized by the features illustrated in the amplifier, the first comparator, the amplitude detector, the integrating circuit, the amplitude limit controller, and the amplitude limitation potential generator (the signal compensation circuit) in the above embodiment. The input circuit is not limited to a detector, and output circuit is not limited to a second comparator.

Those skilled in the art will recognize that further variations are possible within the scope claimed below.

What is claimed is:

1. A signal compensation circuit comprising:
   an amplifier receiving and amplifying an input signal to generate an amplified signal having a direct-current component and an amplitude, the amplifier having an adjustment terminal for adjusting the direct-current component of the amplified signal;
   an integrating circuit including a capacitor that can be charged and discharged at a rate determined by a time constant, the capacitor thus acquiring a potential, said potential being applied to the adjustment terminal of the amplifier;
   a low-speed compensation circuit for detecting changes in the direct-current component of the amplified signal and charging and discharging the capacitor in the integrating circuit in accordance with said changes, at the rate determined by the time constant of the integrating circuit;
   a high-speed compensation circuit for comparing the amplified signal with an allowable amplitude range, and charging and discharging the capacitor in the integrating circuit at a rate faster than the rate determined by the time constant of the integrating circuit, when the amplitude of the amplified signal goes outside the allowable amplitude range; and
   a threshold adjustment circuit for detecting changes in the amplitude of the amplified signal, and adjusting the allowable amplitude range in response to the detected changes in the amplitude.

2. The signal compensation circuit of claim 1, wherein the threshold adjustment circuit increases the allowable amplitude range so as to accommodate the amplified signal.

3. The signal compensation circuit of claim 2, wherein the threshold adjustment circuit increases the allowable amplitude range when the amplitude of the amplified signal goes outside the allowable amplitude range.

4. The signal compensation circuit of claim 3, wherein the threshold adjustment circuit sets the allowable amplitude range to an initial range and waits until the amplified signal goes outside the initial range a predetermined number of times before increasing the allowable amplitude range.

5. The signal compensation circuit of claim 1, wherein the threshold adjustment circuit comprises:
   a signal level detector for comparing the amplified signal with an upper threshold potential and a lower threshold potential, the upper threshold potential and the lower threshold potential defining the allowable amplitude range;
   an amplitude limitation potential generator for generating the upper threshold potential and the lower threshold potential; and
   an amplitude limit controller for adjusting a potential difference between the upper threshold potential and the lower threshold potential.

6. The signal compensation circuit of claim 5, wherein the amplitude limit controller waits until the amplified signal has both gone above the upper threshold potential and gone below the lower threshold limit before starting to adjust the potential difference between the upper threshold potential and the lower threshold potential.

7. A demodulating circuit comprising:
   the signal compensation circuit of claim 1;
   a detector receiving a modulated signal and generating a demodulated signal as the input signal of the amplifier in the signal compensation circuit; and
   a comparator for comparing the amplified signal in the signal compensation circuit with a reference potential, thereby generating a digital output signal.

8. A method of compensating for a direct-current offset of an input signal, comprising the steps of:

(a) amplifying the input signal by an amplifier having a variable direct-current offset, thereby obtaining an amplified signal having a direct-current component;

(b) charging and discharging a capacitor in an integrating circuit according to the direct-current component of the amplified signal, at a rate determined by a time constant of the integrating circuit;

(c) comparing the amplified signal with a pair of threshold potentials defining an allowable amplitude range;

(d) adjusting the pair of threshold potentials according to an amplitude of the amplified signal;

(e) charging and discharging said capacitor, at a rate faster than the rate determined by a time constant of the integrating circuit, when the amplified signal goes outside the allowable amplitude range; and (f) controlling the variable direct-current offset of the amplifier according to a potential of said capacitor.

9. The method of claim 8, wherein said step (d) includes enlarging the allowable amplitude range so as to accommodate the amplified signal.

10. The method of claim 9, wherein said step (d) is carried out when the amplified signal goes outside the allowable amplitude range.

11. The method of claim 10, wherein said step (d) is first carried out when the amplified signal has both gone above and gone below the allowable amplitude range.

* * * * *